United States Patent
Fong et al.

(10) Patent No.: US 7,315,041 B2
(45) Date of Patent: Jan. 1, 2008

(54) SWITCHING DEVICES BASED ON HALF-METALS

(75) Inventors: Ching Yao Fong, Davis, CA (US); Meichun Qian, Davis, CA (US); Lin H. Yang, Pleasanton, CA (US)

(73) Assignee: The Regents of the University of California, Oakland, CA (US)

( * ) Notice: Subject to any disclaimer, the term of this patent is extended or adjusted under 35 U.S.C. 154(b) by 237 days.

(21) Appl. No.: 11/134,002

(22) Filed: May 20, 2005

(65) Prior Publication Data

US 2005/0258416 A1 Nov. 24, 2005

Related U.S. Application Data

(60) Provisional application No. 60/573,069, filed on May 21, 2004.

(51) Int. Cl.
*H01L 43/00* (2006.01)
*H01L 29/00* (2006.01)
(52) U.S. Cl. ......... 257/29; 257/E43.001; 257/E43.004; 257/E29.167; 257/E29.323; 438/48
(58) Field of Classification Search ................. 257/29
See application file for complete search history.

(56) References Cited

U.S. PATENT DOCUMENTS

| 5,757,056 | A | * | 5/1998 | Chui | 257/421 |
| 6,130,814 | A | * | 10/2000 | Sun | 361/143 |
| 6,906,949 | B1 | * | 6/2005 | Nakamura et al. | 365/173 |

* cited by examiner

*Primary Examiner*—Jerome Jackson
(74) *Attorney, Agent, or Firm*—Park, Vaughan & Fleming LLP (57) ABSTRACT

One embodiment of the present invention provides a switching device that can vary a spin-polarized current based on an input signal. The switching device comprises a first conducting region, a second conducting region, and a half-metal region interposed between the first conducting region and the second conducting region. The half-metal region comprises a material which, at the intrinsic Fermi level, has substantially zero available electronic states in a minority spin channel. Changing the voltage of the half-metal region with respect to the first conducting region moves its Fermi level with respect to the electron energy bands of the first conducting region, which changes the number of available electronic states in the majority spin channel, and in doing so, changes the majority-spin polarized current passing through the switching device.

16 Claims, 4 Drawing Sheets

SWITCHING DEVICES BASED ON HALF-METALS

RELATED APPLICATION

This application hereby claims priority under 35 U.S.C. §119 to U.S. Provisional Patent Application No. 60/573,069, filed on 21 May 2004, entitled "Switching devices made of half metals," by inventors Ching Yao Fong, Meichun Qian, and Lin H. Yang.

GOVERNMENT LICENSE RIGHTS

This invention was made with Government support under Grant Nos. 0225007 and 9872053, awarded by the National Science Foundation. The Government has certain rights in this invention.

BACKGROUND

1. Field of the Invention

The present invention is related to switching devices. More specifically, the present invention is related to switching devices comprising half-metals.

2. Related Art

Rapid miniaturization of semiconductor devices has dramatically reduced chip feature sizes. Today, manufacturing technologies can fabricate devices that are as small as hundred nanometers. Many experts believe that device dimensions are destined to enter the realm of quantum mechanics.

This development has offered an unprecedented opportunity to define a radically new class of devices that exploit quantum mechanics to provide unique advantages over existing device technologies.

One such quantum entity is known as spin, which is closely related to magnetism. Devices that rely on an electron's spin as well as their charge to perform computations have given rise to a new field called spintronics (short for spin-based electronics). Note that computing technology has thus far relied mostly on purely charge based devices that move electric charges around, without exploiting the information contained in the spin that tags along for the ride on each electron.

Spintronic devices made of metallic magnetic materials, which exploit the spin of electrons as well as their charge, have already yielded breakthroughs in data storage applications and semiconducting magnetic materials, and they hold the promise of doing the same for microprocessors and a host of other technologies. The success of these latter devices depends on the discovery of materials containing atoms having large atomic magnetic moments and high Curie temperatures.

Specifically, magnetically doped semiconductors are expected to be successfully used to create spintronic devices. These materials can exhibit very high atomic spin moments per magnetic atom. Unfortunately, because of the doping, incoherence of carrier transport can create serious problems in device performance. Furthermore, the most studied doped cubic semiconductor, Mn-doped GaAs, suffers from a low Curie temperature of 110 K. As a result, devices made of Mn-doped GaAs cannot be operated at room temperature.

Half-metals (HM) is a more promising class of materials that is being considered for spintronic applications. Half-metals are so named because one spin channel is metallic while the other is insulating or semiconducting. The polarization of the carriers in the occupied states at the highest energy, the Fermi energy ($E_F$) is thus complete, contributed entirely by one spin channel at the intrinsic Fermi energy. This is in marked contrast to the usual ferromagnetic metals such as iron in which both spin channels contribute at the intrinsic Fermi energy, resulting in substantially less than 100% polarization.

Hence, what is needed is a new class of spintronic switching devices based on half-metals.

SUMMARY

One embodiment of the present invention provides a switching device that can vary a spin-polarized current based on an input signal. The switching device comprises a first conducting region, a second conducting region, and a half-metal region interposed between the first conducting region and the second conducting region. The half-metal region comprises a material which, at the intrinsic Fermi level, has substantially zero available electronic states in a minority spin channel. Changing the voltage of the half-metal region with respect to the first conducting region moves its Fermi level with respect to the electron energy bands of the first conducting region, which changes the number of available electronic states in the majority spin channel, and in doing so, changes the majority-spin polarized current passing through the switching device.

In a variation on this embodiment, the switching device is manufactured by: depositing the first conducting region; depositing the half-metal region over the first conducting region; and depositing the second conducting region over the half-metal region.

In a variation on this embodiment, the first conducting region comprises a material having holes with spin in the minority spin direction, but does not have any holes with spin in the opposite spin direction.

In a variation on this embodiment, the half-metal region comprises CrAs.

In a variation on this embodiment, a conducting region can comprises a p-doped semiconductor or an n-doped semiconductor.

In a further variation on this embodiment, the p-doped semiconductor comprises Mn doped GaAs.

In a further variation on this embodiment, the second region comprises n-doped semiconductor, such as Ge doped GaAs.

One embodiment of the present invention provides a process for manufacturing a switching device that can vary a spin-polarized current based on an input signal. Specifically, the process begins by depositing a first conducting layer. Next, a half-metal layer is deposited over the first conducting layer. Note that the half-metal layer comprises a material which, at the intrinsic Fermi level, has substantially zero available electronic states in a minority spin channel. Then a second conducting layer is deposited over the half-metal layer. Note that changing the voltage of the half-metal layer with respect to the first conducting layer moves the Fermi level with respect to the electron energy bands of the first conducting material, which changes the available electronic states in the majority spin channel, and in doing so, changes the majority-spin polarized current passing through the switching device.

In summary, one embodiment of the present invention proposes a switching device. This switching device comprises a half metal compound that is placed between a modified conventional p-n junction. In this device, (1) the currents under reverse and forward biases are spin polarized, and (2) the I-V curve shows less reverse biased current as compared to the conventional p-n junction and a sawtooth characteristic for both reverse and forward majority spin polarized currents.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Half Metals

In half-metals (HM), the polarization of the carriers is complete, i.e., it is contributed entirely by one spin channel at the intrinsic Fermi energy. This is in marked contrast to the usual ferromagnetic metals such as iron in which both spin channels contribute at the intrinsic Fermi energy, resulting in substantially less than 100% polarization.

Because of the complete polarization in HMs, layered structures incorporating them can exhibit large magnetoresistances, and so show great promise for a variety of device applications. In addition to the Heusler alloys, some transition-metal oxides have been found to have ferromagnetic and HM properties. However, the stoichiometry of the Heusler compounds has proven difficult to control and defects in these compounds limit coherent transport which is essential for most spintronic applications. Furthermore, the transition-metal oxides show diminishing polarization at room temperature.

The complications associated with the aforementioned compounds motivated researchers to find HMs with simple structures, large magnetic moments, and high Curie temperatures. These investigations resulted in the discovery of zinc-blende (ZB) CrAs to be half metallic. Subsequently, the syntheses of monolayer CrSb on GaSb, (Ga,Al)Sb, and GaAs substrates were reported. These new compounds are half metallic, and have large magnetic moments (3.0 Bohr magneton/Cr-atom), high Curie temperatures (experimentally estimated to be 480°K), and a simple ZB structure (eliminating the stoichiometry problem). They are thus very promising for device applications involving existing III-V semiconductor technologies.

Figure 1A:
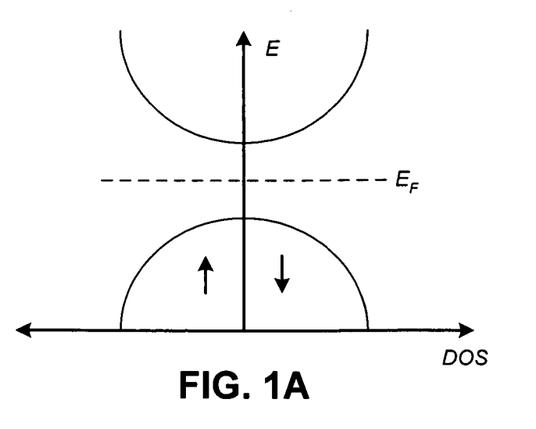
FIGS. 1A, 1B, and 1C illustrate plots of the density of states versus energy for a semiconductor, metal, and a half-metal, respectively, in accordance with an embodiment of the present invention.
Figure 1B:
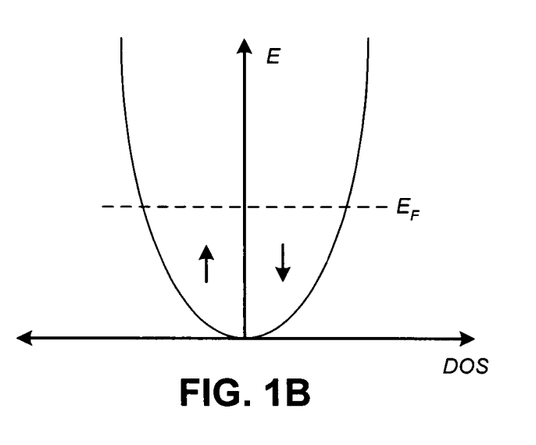
Figure 1C:
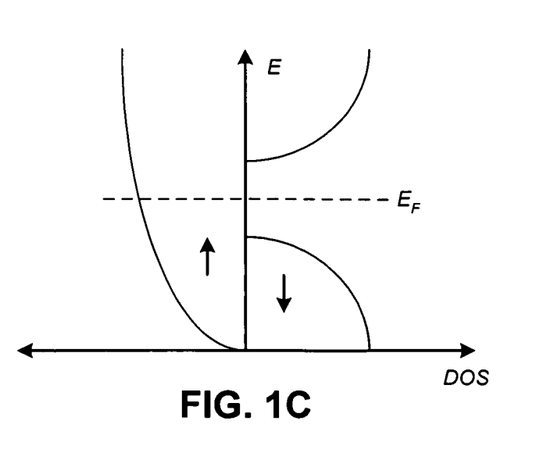

FIGS. 1A, 1B, and 1C illustrate plots of the density of states (DOS) versus the energy for a semiconductor, metal, and a half-metal, respectively, in accordance with an embodiment of the present invention.

Note that the intrinsic Fermi level ($E_F$) is in the band gap for a semiconductor as shown in FIG. 1A. As a result, in an ideal semiconductor, there are zero electron states at the intrinsic Fermi energy level in both electron spin directions. (Note that due to impurities and other imperfections, the number of electron states at the intrinsic Fermi level in an actual semiconductor can be greater than zero, but it is still substantially zero.)

On the other hand, as shown in FIG. 1B, there are a large number of electron states in a metal at the intrinsic Fermi level in either spin direction. Note that the abundance of electron states at the Fermi level is the reason why metals conduct electricity.

Finally, FIG. 1C illustrates the density of states for a half-metal. Note that in the majority spin channel (up spin) there are a large number of states at the intrinsic Fermi level. In contrast, in the other spin direction, namely the minority spin channel (down spin), there are substantially zero electron states at the intrinsic Fermi level. In other words, in a half-metal, one spin channel is metallic while the other is insulating or semiconducting.

Conventional p-n Junction

Before discussing the I-V characteristic of an embodiment of the present invention, we reiterate the I-V curve of a conventional p-n junction.

Figure 2A:
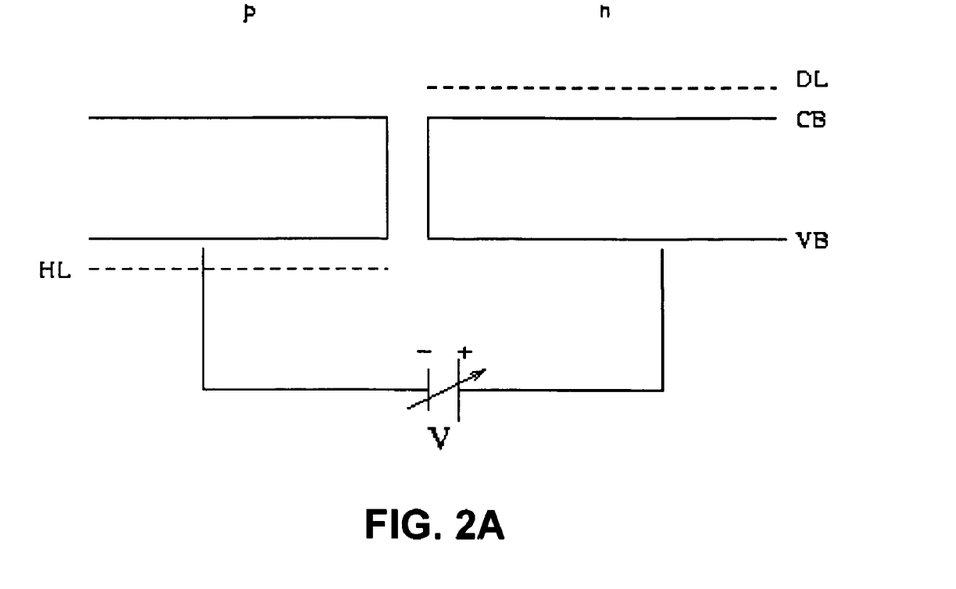
FIG. 2A illustrates the energy band scheme of a conventional p-n junction before the contact of the p-region and n-region in accordance with an embodiment of the present invention.

FIG. 2A illustrates the energy band scheme of a conventional p-n junction before the contact of the p-region and n-region in accordance with an embodiment of the present invention.

Note that the leads of the bias voltage are not in contact with the sample. The conduction band edge is labeled as CB while the valence band edge is called VB. The doping levels are considered to be heavy so that the depletion layer is thin. The hole states in the p-region overlap with the corresponding valence band. The lowest energy hole state in the valence band is labeled as HL. Similarly, the highest energy donor state in the n-region merged into the conduction band is marked as DL. The VB and the CB of the two semiconductor regions are aligned because the two semiconductors are made of the same material (GaAs), albeit doped differently.

Zero Bias

Figure 3A:
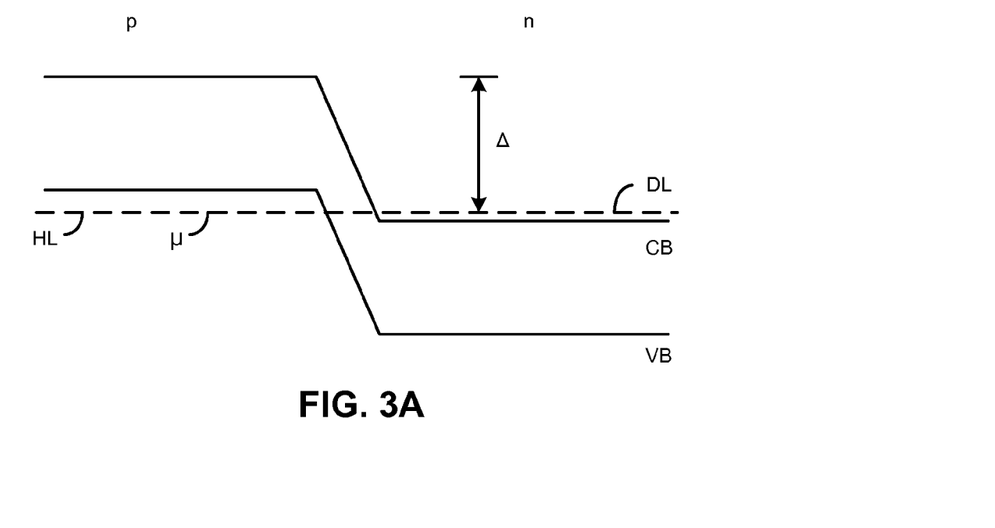
FIG. 3A illustrates the alignment of the energy levels after contact between heavily doped p- and n-regions in accordance with an embodiment of the present invention. (Note that, in FIG. 3A, µ denotes the Fermi level, $E_F$.)

FIG. 3A illustrates the alignment of the energy levels after contact between the p-region and the n-region in accordance with an embodiment of the present invention.

Figure 3B:
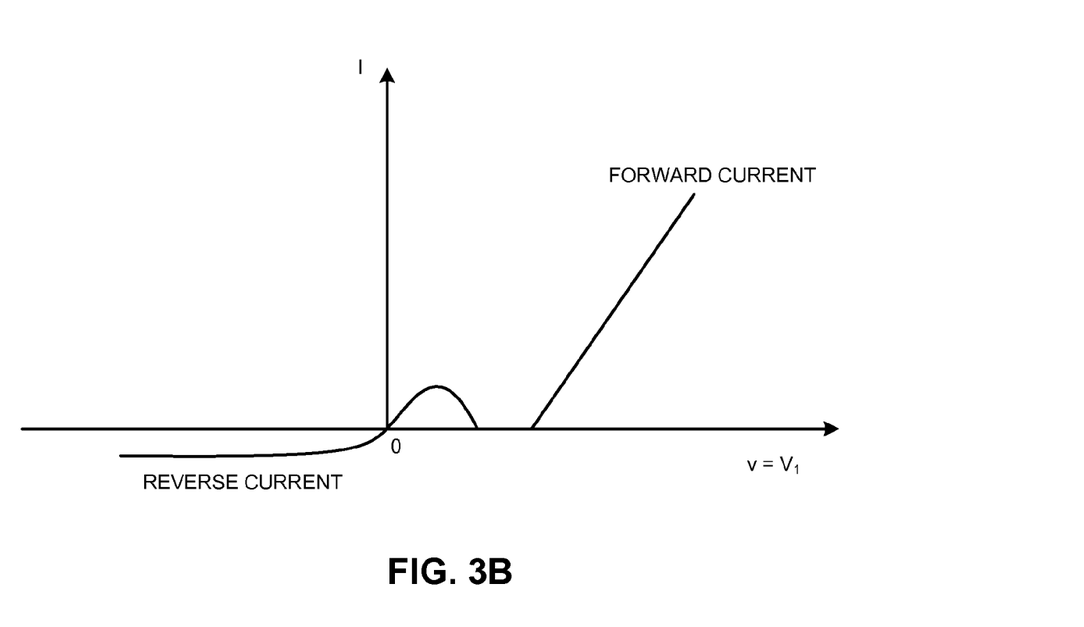
FIG. 3B presents a plot of the I-V characteristic of a conventional p-n junction in accordance with an embodiment of the present invention.

FIG. 3B presents a plot of the I-V characteristic of a conventional p-n junction in accordance with an embodiment of the present invention. (Note that we illustrate the I-V characteristic using electrons as the carriers. One can add the current contributions from holes in a trivial way.)

At this zero bias, electrons from the n-region have to overcome a barrier, Δ, to contribute to the current, $I_{n-p}$ where the subscript means from the n-region to the p-region. A few electrons in the p-region can flow to the right (n-region) and contribute to the current from the p-region to the n-region, $I_{p-n}$. Under equilibrium, the opposite flow of electrons is balanced, which results in a zero net current.

Reverse Bias

In a negative bias (controlled by $V_1$ shown in FIG. 2A), the polarity lowers the energy levels of the n-semiconductor. As a result, current $I_{p-n}$ is not changed. However, electrons contributing to $I_{n-p}$ are reduced because of the higher barrier provided by the bias. The net current is the so-called reversed bias current. It is shown as the negative current in FIG. 3B.

Forward Bias

In a forward bias, the energy levels in the n-region are raised with respect to the p-dope semiconductor. Now electrons can easily flow from the n-side to the p-side because of the reduction of the barrier, $\Delta$, by $eV_1$, where $V_1$ is the forward bias. The resulting "forward current" is shown in FIG. 3B as a positive current.

New Switching Device

One embodiment of the present invention modifies a conventional p-n junction which is made of two differently doped semiconductors. Note that, in a conventional p-n junction, p-type material possesses hole states and the n-type material has donor states. Note that both impurity states are not spin polarized.

Figure 2B:
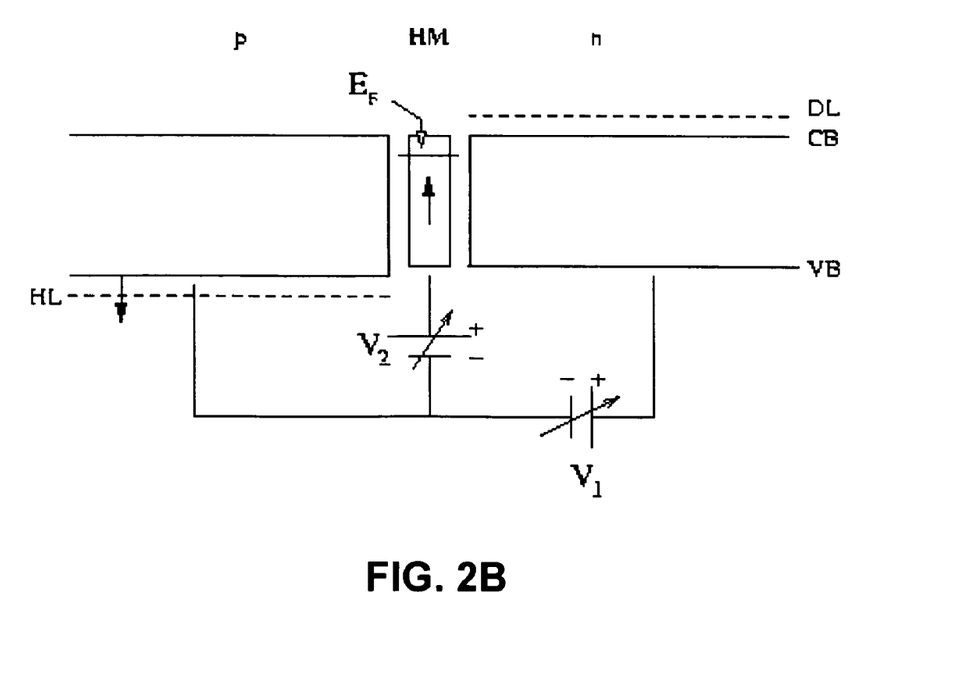
FIG. 2B illustrates the energy band scheme of the new switching device before the contact of the p-region, the half-metal region, and the n-region in accordance with an embodiment of the present invention.

FIG. 2B illustrates the energy band scheme of the new switching device before the contact of the p-region, the half-metal region, and the n-region in accordance with an embodiment of the present invention.

As shown in FIG. 2B, the convention p-n junction is modified by: (1) replacing the usual p-doped semiconductor by a Mn doped GaAs, (2) inserting a HM, such as CrAs (conducting carriers occupying majority spin states), between the p- and the n-doped semiconductors, and (3) applying two bias voltages instead of one as in the usual p-n junction. The two biases are: (i) $V_1$, which is placed between the p-doped semiconductor and the n-doped semiconductor as in a conventional p-n junction, and (ii) $V_2$, which controls the voltage of the HM with reference to the p-doped region. In FIG. 2A, we show the arrangement of the bias for the conventional p-n junction, while in FIG. 2B the organization of the bias voltages of the new device is given.

Note that the technology of growing Mn doped GaAs is more mature than the technology for growing other dopants in GaAs. It is also well established experimentally that the minority spin states form the hole states which are the carriers in the Mn doped GaAs (the downward arrow shown in FIG. 2B indicates the direction of the spin of the holes). Specifically, in one embodiment, the n-doped semiconductor can be a Ge-doped GaAs. It is emphasized that the donor states are not spin polarized.

Furthermore, note that, heavy doping in conventional p-n junction can cause tunnel diode behavior (as shown in FIG. 3B for the curved I-V curve at small $V_1$). The presence of the HM stops the tunneling effect because the spins in HM and hole states in the p-region are in opposite directions. If we apply external magnetic field to reverse the magnetization in the HM region, then tunneling can occur. This is the origin of the magnetoresistance effect.

Additionally, note that the valence electrons in the p-region can tunnel to the n-region at a large reverse bias. Specifically, with a large reverse bias, the DL in FIG. 2B can be lower than the HL. The valence electrons with energy less than HL but above DL in the p-region can tunnel to the n-region. This tunneling current will show sawtooth behavior which can be controlled by the Fermi level ($E_F$) of the HM. For example, if the Fermi level in the HM region is at the level of HL, current stops because the states below the Fermi level are occupied. This phenomenon is shown by the sharp edge of negative sawtooth shape current in FIG. 3C. Moreover, the voltage needed for switching in this case is expected to be smaller than the case for forward bias. The reason is that the Fermi level of the HM varies only between the HL and the DL which can be controlled by $V_1$, the bias voltage between the p- and n-region.

I-V Characteristics for the New Switching Device

Note that the distinct features of the carriers in different regions of the new switching device (FIG. 2B) are compared to the conventional junction shown in FIG. 2A. Specifically, the hole states in the p-region are polarized and they are the down spin states, and the conducting states in the HM region are the spin up states. Before the three regions are in contact, the energy level scheme is shown in FIG. 2B. The blank regions between the p-semiconductor and the HM and between the HM and the n-semiconductor indicate the separations. Note that, in FIG. 2B, the bias voltages are also not connected to the sample.

Furthermore, we neglect the effect of the semiconducting property of the minority spin states based on the fact that the calculated gap of CrAs is 1.85 eV. Note that this value underestimates the actual gap by about a factor of 2, because of the use of the so-called generalized gradient approximation within the density functional theory. In fact, the gap can be more than 3.0 eV. (The measured gap of GaAs is 1.5 eV.)

Reverse Bias

When a negative bias is applied between the p- and n-regions controlled by $V_1$ as shown in FIG. 2B, we can make use of the unique additional degree of freedom provided by the HM. Specifically, we can tune the bias between the p-region and the HM ($V_2$ in FIG. 2B) to control the position of the Fermi level relative to the energy levels of the semiconductors for determining the magnitude of the reverse biased current. To simplify the argument, we can adjust $V_2$ in such a way that the Fermi level ($E_F$) of the HM is at the same level as the CB level in the p-region. Note that, if we do this, there will be no current contributed from the minority spin donor electrons because the available states in the HM region have an up spin polarization. Instead, only donor electrons with the majority spin can contribute to the reversed biased current.

Furthermore, there is no tunneling for electrons in the n-region to the p-region to occupy the hole states because their spin directions are in opposite direction to the one in the HM. Therefore, the net magnitude of the reverse current should be less than the case of the conventional p-n junction shown in FIG. 3B. When the bias is large, the valence electrons below HL in the p-region can tunnel to the states in the unoccupied donor states and conduction bands. (Note that this situation is the same as the one described in a previous paragraph.)

Forward Bias

Figure 3C:
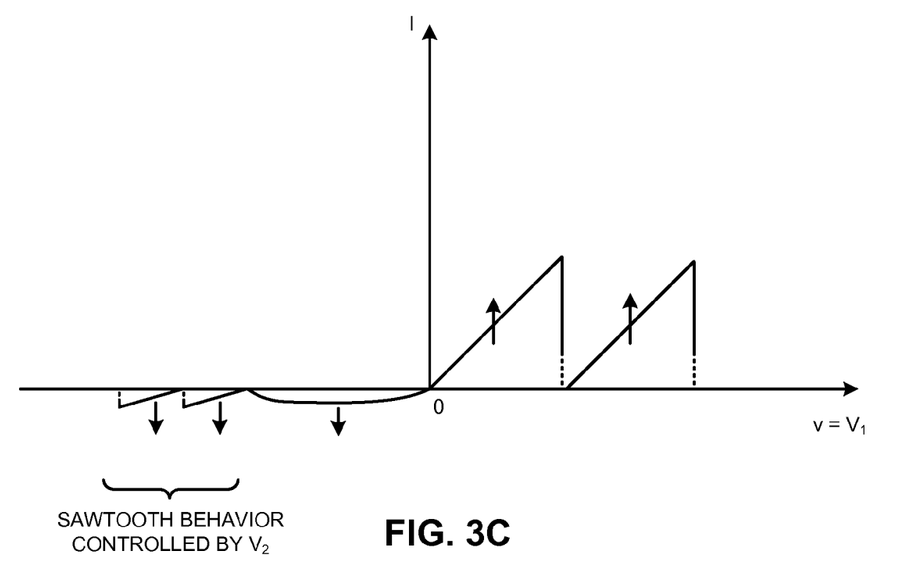
FIG. 3C presents a plot of the I-V characteristic of the new switching device in accordance with an embodiment of the present invention.

FIG. 3C presents a plot of the I-V characteristic of the new switching device in accordance with an embodiment of the present invention.

When a positive bias is applied to the junction so that the Fermi level of the HM is adjusted to provide available states, only donor electrons with the majority spin polarization will contribute to the current. The donor electrons with the minority spin are stopped by the HM. Consequently, the forward biased current is now majority spin polarized as opposed to the conventional junction case, in which the current is not polarized.

We can further make use of the additional feature provided by the HM compound, which is to tune the Fermi level of the HM. If the Fermi level is placed at an energy higher than the CB of the p-doped semiconductor, the forward current can either be reduced or be interrupted (effectively increase the barrier) due to the fact the states below the Fermi level in the HM are all occupied. On the other hand, we can lower the Fermi level of the HM to increase or allow forward current.

In other words, by changing the bias $V_2$ to shift the Fermi level of the HM, we can switch on, reduce, and switch off the forward spin polarized current. Note that FIG. 3C shows the sawtooth characteristic of the forward current for the new device. The abrupt edge of the sawtooth is the consequence of the change of $V_2$.

Process of Manufacturing the New Switching Device

In one embodiment of the present invention, the switching device can be manufactured using a molecular beam epitaxial growth method. Specifically, a GaAs substrate can be used. For example, several layers of Mn doped GaAs can be grown first, after which a thin film of CrAs for the HM region can be grown. Finally the Ge doped GaAs can be grown on top of the other two layers.

A technique of growing Mn doped GaAs can be found in K. C. Ku et al., *Appl. Phys. Lett.* 82, 2302 (2003). The feasibility for growing thin layer of CrAs on GaAs can be found in H. Akinaga et al., Jn. Appl. Phys. Lett. 118, L1118 (2000).

In another embodiment, the switching device can be manufactured using $Mn_xGa_{1-x}Sb/MnSb/Ge_xGa_{1-x}Sb$. Note that using MnSb can be beneficial because its HM properties occur at its equilibrium lattice constant and the magnetic moment is 4.0 Bohr magneton/Mn-atom (see Pask et al. Phy. Rev. B67, 224420 (2003)). As a result, the resulting device is expected to have less strain and large magnetic moment.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A switching device that can vary a spin-polarized current based on an input signal, the switching device comprising:

a type region that has holes with spin in a minority spin direction, but does not have any holes with spin in a direction that is opposite to the minority spin direction;

an n-type region; and a half-metal region interposed between the p-type region and the n-type region, wherein at the half-metal region's intrinsic Fermi level, the half-metal region has substantially zero available electronic states in a minority spin channel;

wherein changing a voltage of the half-metal region with respect to the p-type region moves the half-metal region's Fermi level with respect to the p-type region's electron energy bands, which changes the number of available electronic states at the half-metal region's Fermi level in a majority spin channel, and in doing so, changes a majority-spin polarized current passing through the switching device.

2. The switching device of claim 1, wherein the half-metal region comprises CrAs.

3. The switching device of claim 1, wherein the p-type region comprises Mn doped GaAs.

4. The switching device of claim 1, wherein the n-type region comprises Ge doped GaAs.

5. The switching device of claim 1, wherein the switching device is manufactured using a process that includes depositing the half-metal region.

6. A computer system that includes a switching device that can vary a spin-polarized current based on an input signal, the computer system comprising:

a processor;

a memory;

a switching device within the processor;

a p-type region within the switching device that has holes with spin in a minority spin direction, but does not have any holes with spin in a direction that is opposite to the minority spin direction;

an n-type region within the switching device; and a half-metal region interposed between the p-type region and the n-type region, wherein at the half-metal region's intrinsic Fermi level, the half-metal region has substantially zero available electronic states in a minority spin channel;

wherein changing a voltage of the half-metal region with respect to the p-type region moves the half-metal region's Fermi level with respect to the p-type region's electron energy bands, which changes the number of available electronic states at the half-metal region's Fermi level in a majority spin channel, and in doing so, changes a majority-spin polarized current passing through the switching device.

7. The computer system of claim 6, wherein the half-metal region comprises CrAs.

8. The computer system of claim 6, wherein the p-type region comprises Mn doped GaAs.

9. The computer system of claim 6, wherein the n-type region comprises Ge doped GaAs.

10. The computer system of claim 6, wherein the switching device is manufactured using a process that includes depositing the half-metal region.

11. An apparatus that includes a switching device that can vary a spin-polarized current based on an input signal, the switching device comprising:

a p-type region that has holes with spin in a minority spin direction, but does not have any holes with spin in a direction that is opposite to the minority spin direction;

an n-type region; and a half-metal region interposed between the p-type region and the n-type region, wherein at the half-metal region's intrinsic Fermi level, the half-metal region has substantially zero available electronic states in a minority spin channel;

wherein changing a voltage of the half-metal region with respect to the p-type region moves the half-metal region's Fermi level with respect to the p-type region's electron energy bands, which changes the number of available electronic states at the half-metal region's Fermi level in a majority spin channel, and in doing so, changes a majority-spin polarized current passing through the switching device.

12. The apparatus of claim 11, wherein the half-metal region comprises CrAs.

13. The apparatus of claim 11, wherein the p-type region comprises Mn doped GaAs.

14. The apparatus of claim 11, wherein the n-type region comprises Ge doped GaAs.

15. The apparatus of claim 11, wherein the switching device is manufactured using a process that includes depositing the half-metal region.

16. A process for manufacturing a switching device that can vary a spin-polarized current based on an input signal, the process comprising:

depositing a p-type region that has holes with spin in a minority spin direction, but does not have any holes with spin in a direction that is opposite to the minority spin direction;

depositing a half-metal region over the p-type region, wherein at the half-metal region's intrinsic Fermi level, the half-metal region has substantially zero available electronic states in a minority spin channel; and depositing an n-type region over the half-metal region;

wherein changing a voltage of the half-metal region with respect to the p-type region moves the half-metal region's Fermi level with respect to the p-type region's electron energy bands, which changes the number of available electronic states at the half-metal region's Fermi level in a majority spin channel, and in doing so, changes a majority-spin polarized current passing through the switching device.

* * * * *

UNITED STATES PATENT AND TRADEMARK OFFICE
CERTIFICATE OF CORRECTION

| | | |
|---|---|---|
| PATENT NO. | : 7,315,041 B2 | Page 1 of 1 |
| APPLICATION NO. | : 11/134002 | |
| DATED | : January 1, 2008 | |
| INVENTOR(S) | : Ching Yao Fong et al. | |

It is certified that error appears in the above-identified patent and that said Letters Patent is hereby corrected as shown below:

In claim 1 (at column 7, line 51), please delete the words "a type region" and replace with --a p-type region--.

Signed and Sealed this

Sixth Day of May, 2008

JON W. DUDAS
*Director of the United States Patent and Trademark Office*